(12) United States Patent  (10) Patent No.: US 8,707,135 B2
Tu et al.  (45) Date of Patent: *Apr. 22, 2014

(54) METHOD AND SYSTEM OF DYNAMIC DATA STORAGE FOR ERROR CORRECTION IN A MEMORY DEVICE

(71) Applicant: Skymedi Corporation, Hsinchu (TW)

(72) Inventors: Chih-Cheng Tu, Hsinchu (TW);
Yan-Wun Huang, Hsinchu (TW);
Han-Lung Huang, Hsinchu (TW);
Ming-Hung Chou, Hsinchu (TW);
Chien-Fu Huang, Hsinchu (TW);
Chih-Hwa Chang, Hsinchu (TW)

(73) Assignee: Skymedi Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/783,069

(22) Filed: Mar. 1, 2013

(65) Prior Publication Data

US 2013/0179749 A1  Jul. 11, 2013

Related U.S. Application Data

(63) Continuation of application No. 12/548,348, filed on Aug. 26, 2009, now Pat. No. 8,429,497.

(51) Int. Cl.
*G06F 11/00* (2006.01)

(52) U.S. Cl.
USPC .................... 714/764; 714/6.1; 714/54

(58) Field of Classification Search
None
See application file for complete search history.

(56) References Cited

U.S. PATENT DOCUMENTS

| 5,442,638 | A | 8/1995 | Awad et al. |
| 2003/0097609 | A1 | 5/2003 | Harari et al. |
| 2007/0089031 | A1* | 4/2007 | Huffman et al. ............. 714/763 |
| 2007/0294588 | A1 | 12/2007 | Coulson |
| 2008/0282106 | A1* | 11/2008 | Shalvi et al. ..................... 714/6 |

* cited by examiner

*Primary Examiner* — Kamini Patel
*Assistant Examiner* — Jason Bryan
(74) *Attorney, Agent, or Firm* — Huffman Law Group, P.C.

(57) ABSTRACT

A method of dynamic data storage for error correction in a memory device is disclosed. Data for storage is received, the received data is encoded and error correction code (ECC) is generated. The encoded data is stored in the memory device that includes a plurality of pages each having a plurality of data partitions. More corrected errors a marked page has, a smaller portion with a space of at least one datum of each of the corresponding data partitions associated with the marked page is allocated to store the encoded data, while a size of the ECC is fixed, thereby increasing capability of correcting errors in the marked page.

12 Claims, 8 Drawing Sheets

METHOD AND SYSTEM OF DYNAMIC DATA STORAGE FOR ERROR CORRECTION IN A MEMORY DEVICE

CROSS-REFERENCE TO RELATED APPLICATIONS

The present application is a Continuation of U.S. application Ser. No. 12/548,348 filed on Aug. 26, 2009, now U.S. Pat. No. 8,429,497, the complete subject matter of which is incorporated herein by reference.

BACKGROUND OF THE INVENTION

1. Field of the Invention

The present invention generally relates to a storage device, and more particularly to a system and method of dynamic data storage for error correction in the storage device.

2. Description of the Prior Art

Error detection and correction is important in maintaining data reliability in a storage device such as a semiconductor-based memory device. This fact becomes more significant as either the density or the number of bits stored in each memory cell increases. Moreover, the semiconductor-based memory device such as a flash memory may have bad bits that are either produced during the manufacturing or arose from substantial cycles of read and write.

Error correction code (ECC) is therefore used to improve the reliability in the memory device. However, the ECC in the conventional memory device is not effective. For the worse, when the number of errors exceeds the capability of the error correction scheme, the data stored in the memory device no longer can be recovered and are lost forever.

For the reason that the conventional memory device could not effectively correct error(s) and prevent data loss, a need has arisen to propose a novel memory system and method for effectively improving reliability of data in the memory device and preventing data loss.

SUMMARY OF THE INVENTION

In view of the foregoing, it is an object of the present embodiment to provide a system and method of dynamic data storage for error correction in a memory device in order to dynamically and effectively correct error(s).

According to one embodiment, a method of dynamic data storage for error correction in a memory device is provided. The method comprises the following: receiving data for storage; encoding the data and generating associated error correction code (ECC); and storing the encoded data in a portion of a data partition of the memory device, wherein percentage of the stored data in the data partition is determined according to an amount of corrected errors associated with the data partition or is predetermined.

According to another embodiment, a method of dynamic data storage for error correction in a memory device is provided. The method comprises the following: receiving data for storage; determining whether a destination page for storing the received data has been marked previously, wherein the marked page is generated by: (a) reading and decoding a page of data in the memory device, the page including a plurality of data partitions in a data storage area; (b) comparing a number of corrected errors with a predetermined threshold; and (c) marking the page when the number of corrected errors exceeds the predetermined threshold; determining data percentage to be placed in the data partition of the marked page according to the number of corrected errors or predetermining the data percentage; encoding the received data and associated error correction code (ECC) is generated; storing the encoded data and the ECC in the data partition of the marked page according to the determined percentage.

According to still another embodiment, a system of dynamic data storage for error correction in a memory device is provided. The system comprises a memory device and a memory controller, wherein the memory controller is for receiving data for storage in the memory device, and for encoding the data and generating associated error correction code (ECC). Additionally, the encoded data is stored in a portion of a data partition of the memory device, wherein percentage of the stored data in the data partition is determined according to an amount of corrected errors associated with the data partition or is predetermined.

DETAILED DESCRIPTION OF THE INVENTION

Figure 1:
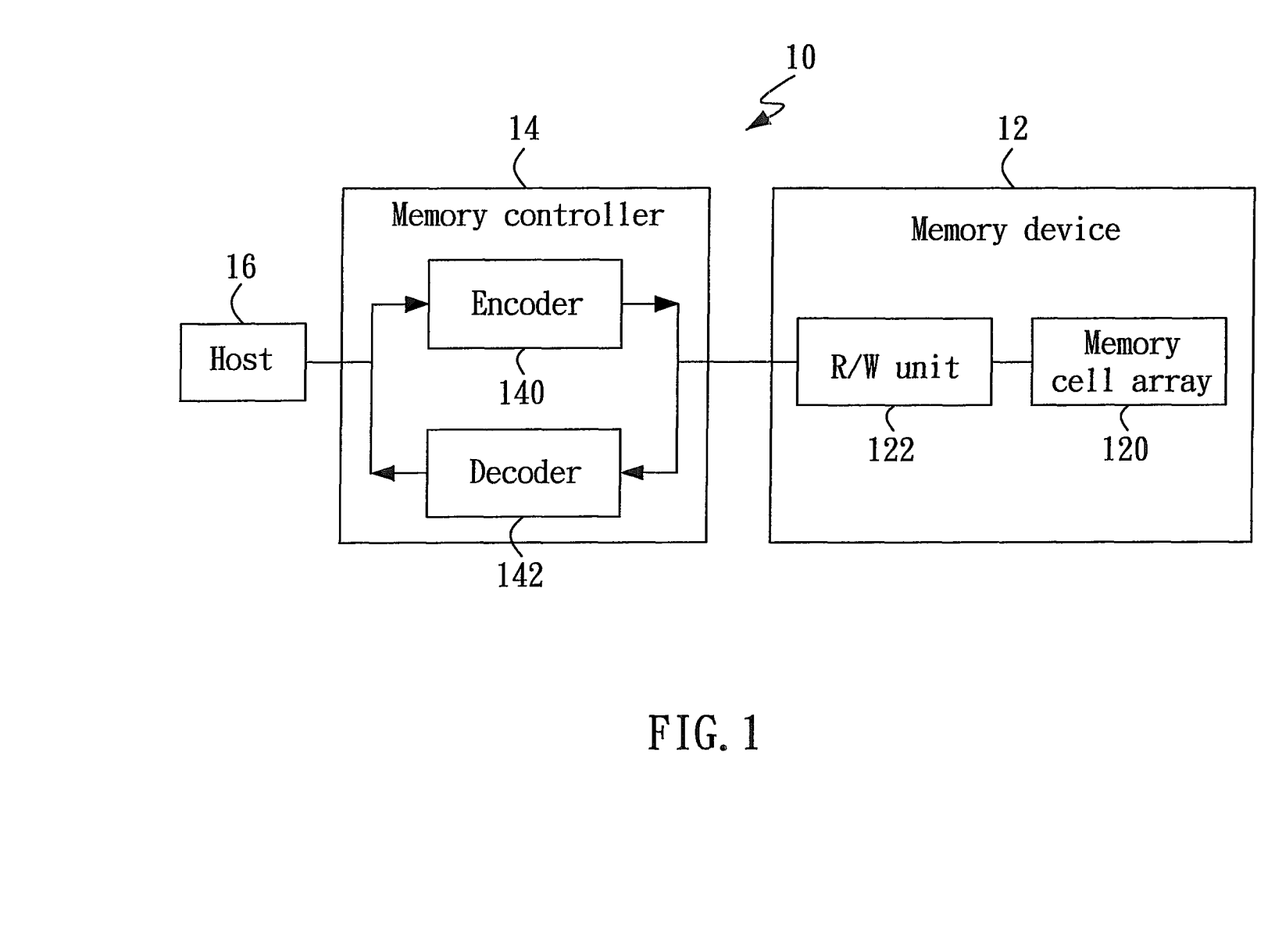
FIG. 1 is a block diagram that illustrates a memory system according to one embodiment of the present invention.

FIG. 1 is a block diagram that illustrates a memory system 10 according to one embodiment of the present invention. In the embodiment, the memory system 10 includes a memory device 12, a memory controller 14 and a host 16. The memory device 12 may in general be any storage device or storage medium, and may specifically be a flash memory in the embodiment. With respect to the flash memory, one type of a non-volatile solid state memory device that can be electrically erased and reprogrammed, it is capable of storing a single bit of information in each memory cell of a single-level cell (SLC) flash memory, or is capable of storing two or more bits of information in each memory cell of a multi-level cell (MLC) flash memory.

In the embodiment, the memory device or the flash memory 12 includes a memory cell array 120, and a read/write (R/W) unit 122 that writes data into or reads data from the memory cell array 120. The memory controller 14 includes an error correction code (ECC) encoder 140 that encodes the data (provided from the host 16) to be written to the memory device 12, and an ECC decoder 142 that decodes the data (provided from the memory device 12) to be read by the host 16.

Figure 2:
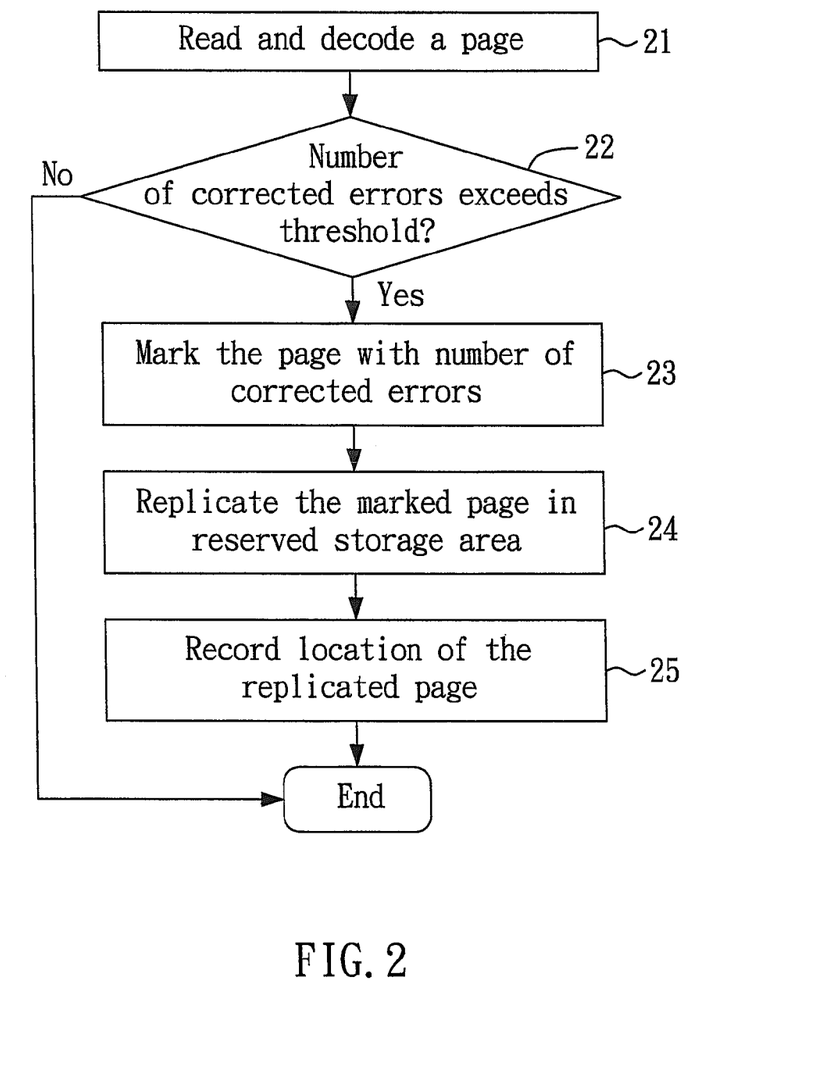
FIG. 2 is a flow diagram that illustrates a method of data retrieval from a memory device according to the embodiment of the present invention.
Figure 3A:
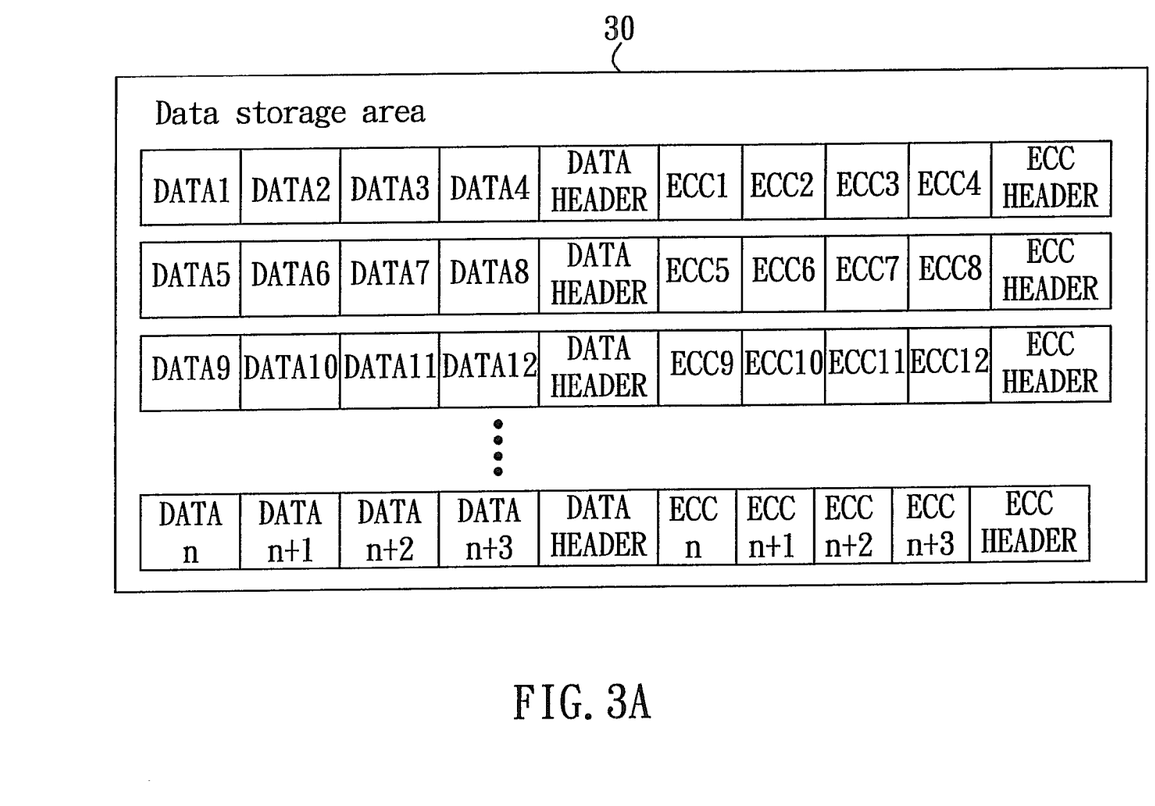
FIG. 3A exemplifies placement of the data and the ECCs in a data storage area of the memory device.
Figure 3B:
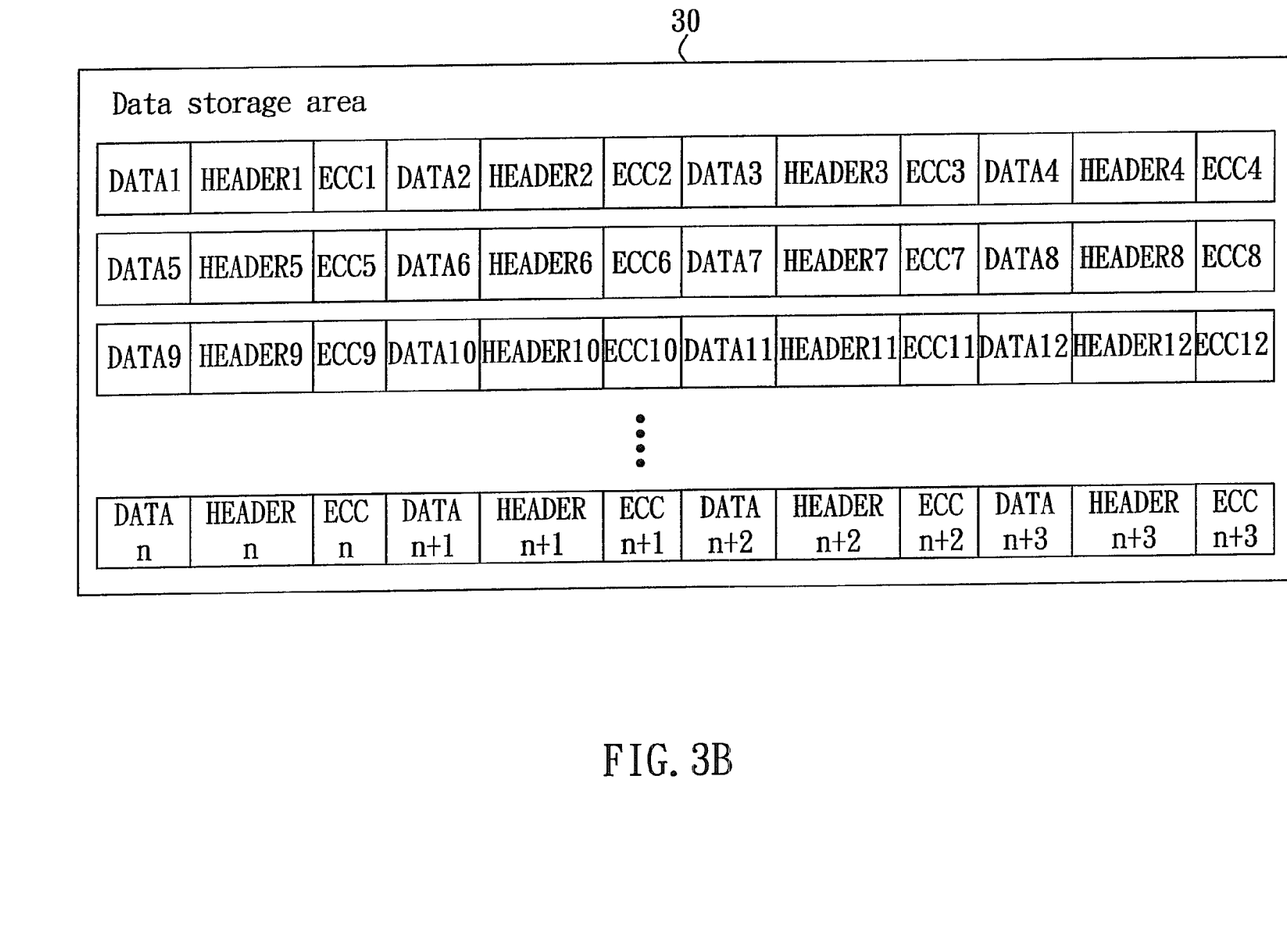
FIG. 3B exemplifies another placement of the data and the ECCs in a data storage area of the memory device.

FIG. 2 is a flow diagram that illustrates a method of data retrieval from a memory device according to the embodiment of the present invention. In the step 21, a page of data is read and decoded. FIG. 3A exemplifies placement of the data and the ECCs in a data storage area 30 of the memory device. Each page, in the embodiment, may consist of four data partitions each having 1K bytes in size. For example, a first data partition (DATA1), a second data partition (DATA2), a third data partition (DATA3) and a fourth data partition (DATA4) are stored in sequence in a first page, followed by a data header. Subsequently, associated ECCs (i.e., ECC1, ECC2, ECC3 and ECC4) or redundant data are stored in sequence in the same page, followed by an ECC header. FIG. 3B exemplifies another placement of the data and the ECCs in a data storage area 30 of the memory device. In this exemplary placement, each data partition is immediately followed by a header and its associated ECC. In other words, each data partition and its associated header and ECC are stored in succession in a consecutive manner. The header may be used to store auxiliary information necessary for facilitating the data storage or/and retrieval.

Referring back to FIG. 2, in the step 22, the number of errors being corrected in a page during the decoding (in the step 21) is then compared with a predetermined threshold. The predetermined threshold, in the embodiment, may be less than the maximum number of errors that the employed error correction scheme can capably correct. When the number of corrected errors does not exceed the predetermined threshold, the data are normally read and forwarded to the host. Otherwise, when the number of corrected errors exceeds the predetermined threshold, the corresponding page is marked with the number of corrected errors in the step 23.

Figure 4:
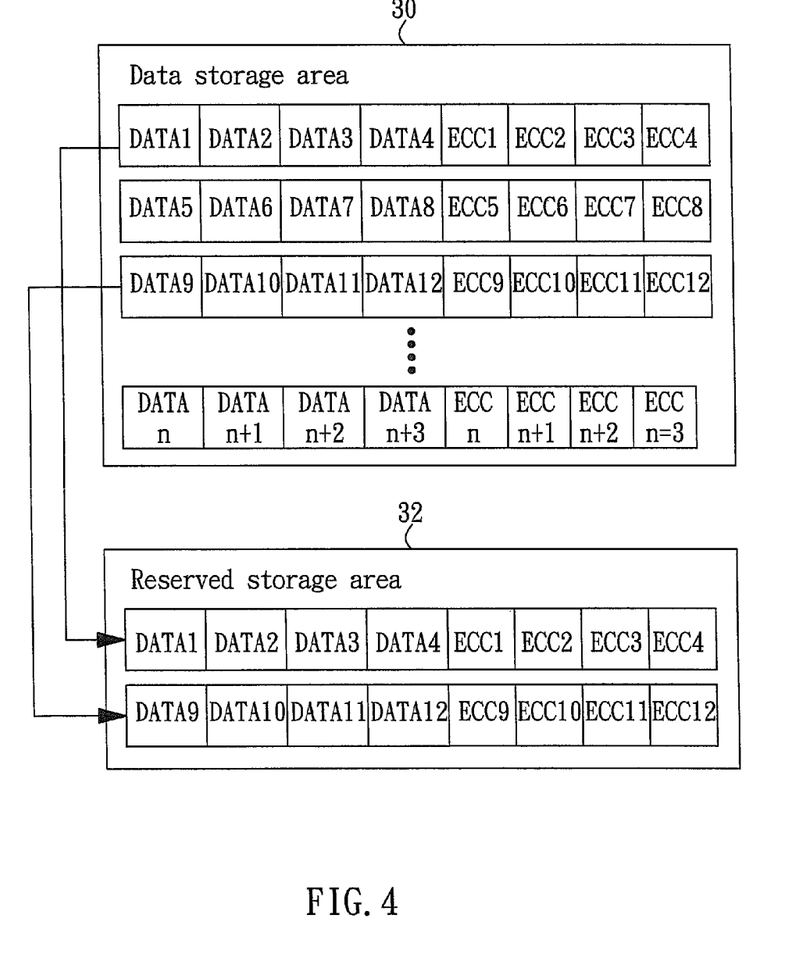
FIG. 4 schematically exemplifies a memory device that is divided into a data storage area and a reserved storage area.

Subsequently, in the step 24, the marked page or pages of data are replicated and reserved in a reserved storage area 32 that is set aside along with the data storage area 30 in the memory device. Further, the location(s) of the replicated page(s) are recorded in the step 25. FIG. 4 schematically exemplifies a memory device that is divided into a data storage area 30 and a reserved storage area 32. In this example, the first page and the third page are marked, and are then replicated and reserved in the reserved storage area 32 respectively. Generally speaking, a number of errors exceeding the predetermined threshold indicate that the area of the marked page is deteriorating. In order to prevent loss of data in the future, the marked page of data is reserved in the reserved storage area 32 for retrieval when the marked page in the data storage area did become un-recoverable as being beyond the capability of the employed error correction scheme.

Figure 5:
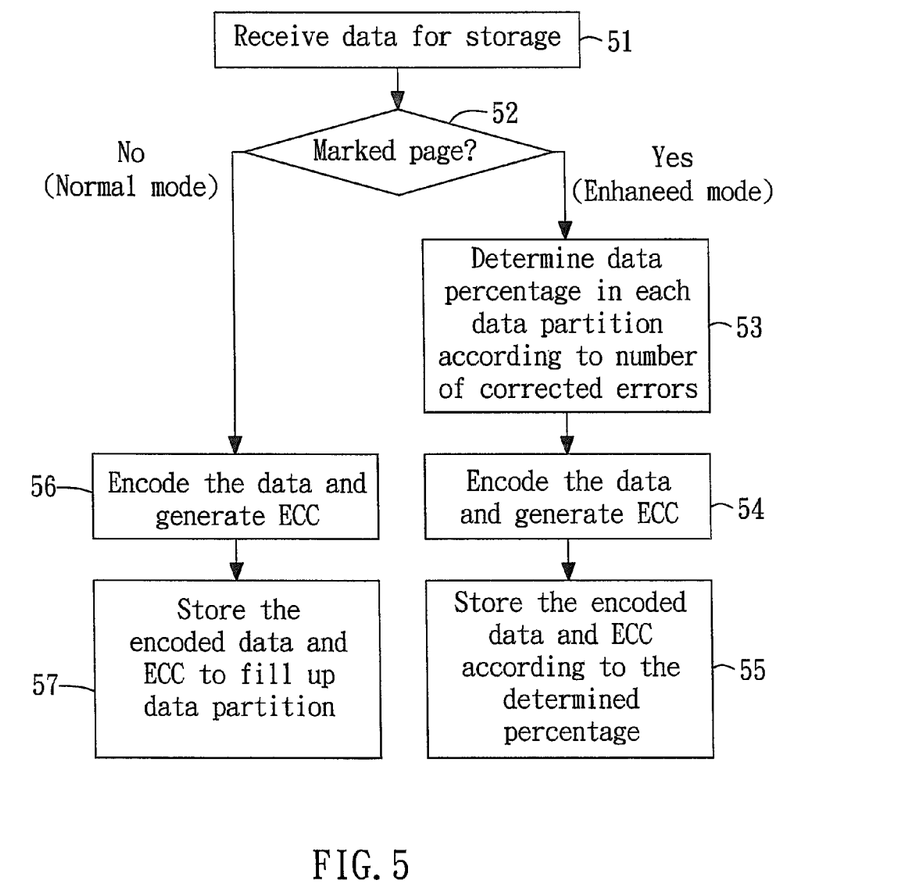
FIG. 5 is a flow diagram that illustrates a method of dynamic data storage for error correction in a memory device according to one embodiment of the present invention.
Figure 6A:
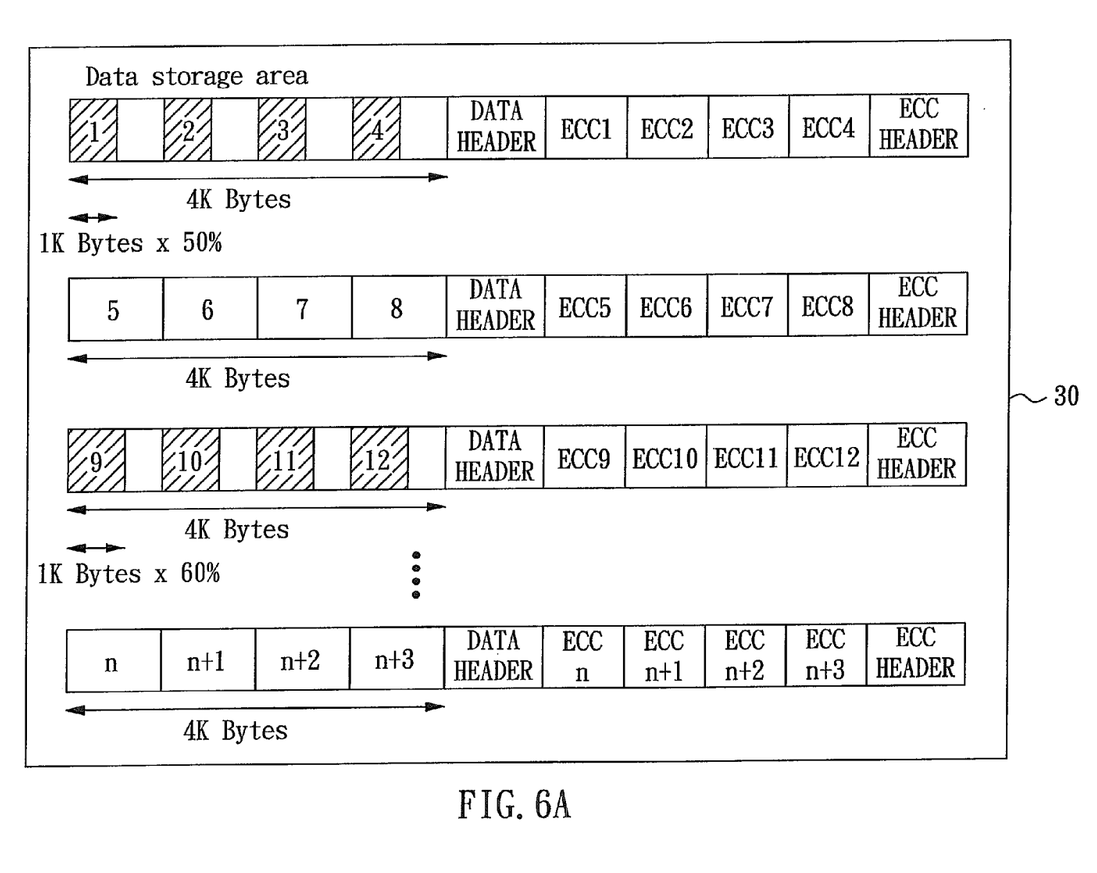
FIG. 6A exemplifies placement of the data and the ECCs in a data storage area of the memory device in an enhanced mode.

FIG. 5 is a flow diagram that illustrates a method of dynamic data storage for error correction in a memory device according to one embodiment of the present invention. In the step 51, data for storage are received, for example, from the host. Subsequently, in the step 52, the status of the destination page for storing the received data is checked to determine whether the page has been marked. If the page is determined to be a marked page, an enhanced mode ensues. In this enhanced mode, the percentage of data to be placed in each data partition is determined, in the step 53, according to the number of corrected errors. In another embodiment, the percentage of data to be placed in each data partition is predetermined, for example, before the memory device has been shipped out of a factory. Thereafter, the data are encoded and associated ECC is generated (the step 54), and the encoded data along with the ECC are then stored in the data storage area 30 according the determined data percentage (the step 55). FIG. 6A exemplifies placement of the data and the ECCs in a data storage area 30 of the memory device in the enhanced mode. In this example, 50 percent of data (e.g., 0.5K bytes) are placed in each data partition of the first page. The other 50 percent of the data partition remains known value (ex. 00 or FF). With respect to the third page, as the number of corrected errors is less than that of the first page, 60 percent of data (e.g., 0.6K bytes) are placed in each data partition of the third page. The other 40 percent of the data partition remains known value (ex. 00 or FF). In general, fewer percent of data are placed in each data partition with respect to a larger number of corrected errors, and vice versa. Accordingly, the capability of correcting error(s) in each data partition increases even the size of each associated ECC remains fixed, thereby improving reliability and life-span of the memory device.

On the other hand, if the page is determined to be not a marked page in the step 52, a normal mode ensues. In this normal mode, the data are encoded and associated ECC is generated (the step 56), and the encoded data along with the ECC are then stored in the data storage area 30 to fill up each data partition (the step 57).

Figure 6B:
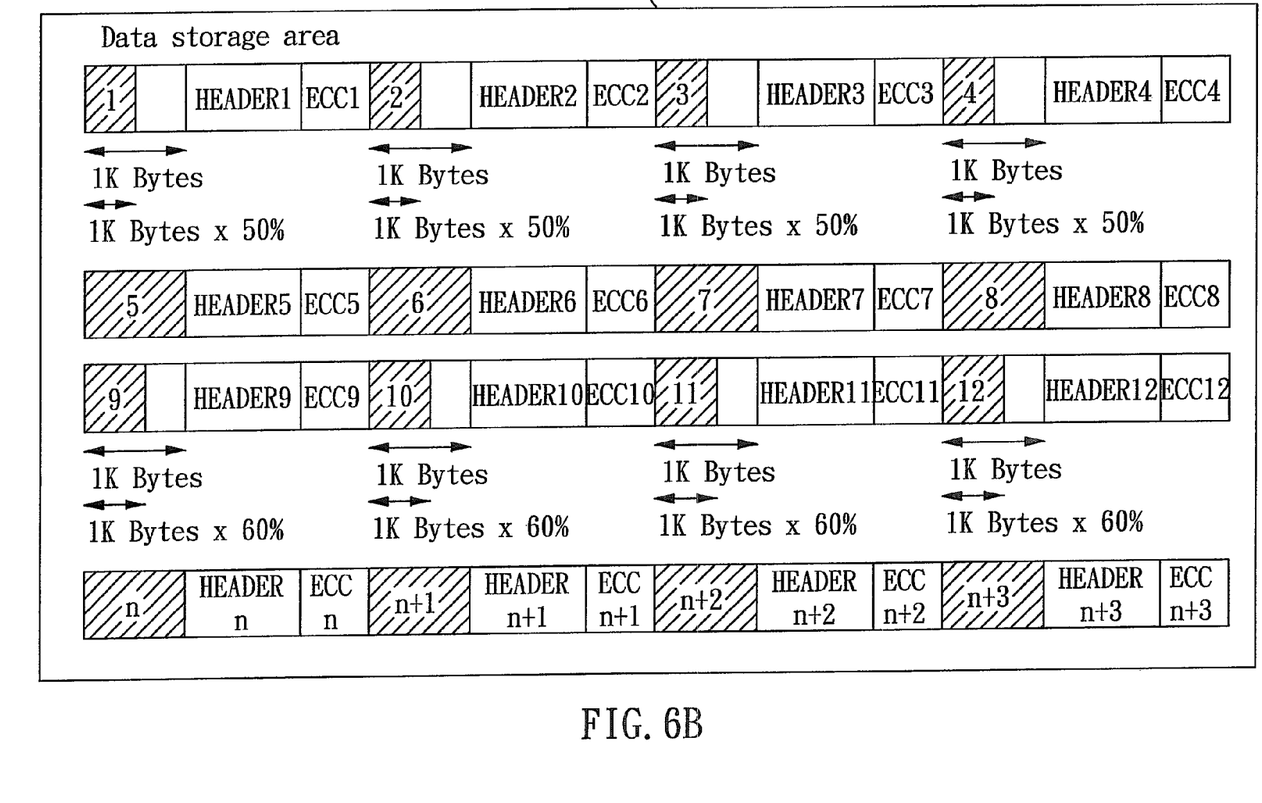
FIG. 6B exemplifies another placement of the data and the ECCs in a data storage area of the memory device in the enhanced mode.

FIG. 6B exemplifies another placement of the data and the ECCs in a data storage area 30 of the memory device in the enhanced mode. In this exemplary placement, each data partition is immediately followed by a header and its associated ECC. In other words, each data partition and its associated header and ECC are stored in succession in a consecutive manner. The header may be used to store auxiliary information necessary for facilitating the data storage or/and retrieval.

Although specific embodiments have been illustrated and described, it will be appreciated by those skilled in the art that various modifications may be made without departing from the scope of the present invention, which is intended to be limited solely by the appended claims.

What is claimed is:

1. A method of dynamic data storage for error correction in a memory device, comprising:
   receiving data for storage;
   encoding the received data and generating error correction code (ECC); and
   storing the encoded data in the memory device that includes a plurality of pages each having a plurality of data partitions, wherein the more corrected errors a marked page has, a smaller portion of each of the corresponding data partitions associated with the marked page is allocated to store the encoded data, while a size of the ECC is fixed, thereby increasing capability of correcting errors in the marked page.

2. The method of claim 1, wherein an amount of the corrected errors is obtained from a read cycle.

3. The method of claim 1, wherein the data partition and the ECC have fixed sizes respectively.

4. The method of claim 1, wherein the encoded data are stored to fill up the data partition when an amount of the corrected errors is below a predetermined threshold.

5. The method of claim 2, further comprising a step of marking a page to result in the marked page when the amount of corrected errors in said page exceeds a predetermined threshold.

6. The method of claim 5, further comprising a step of replicating and storing the marked page in a reserved storage area of the memory device.

7. A system of dynamic data storage for error correction in a memory device, comprising:
   a memory device that includes a plurality of pages each having a plurality of data partitions; and
   a memory controller for receiving data for storage in the memory device, and for encoding the data and generating error correction code (ECC);
   wherein the encoded data are stored in the memory device such that the more corrected errors a marked page has, a smaller portion of each of the corresponding data partitions associated with the marked page is allocated to store the encoded data, while a size of the ECC is fixed, thereby increasing capability of correcting errors in the marked page.

8. The system of claim 7, wherein an amount of the corrected errors is obtained from a read cycle.

9. The system of claim 7, wherein the data partition and the ECC have fixed sizes respectively.

10. The system of claim 7, wherein the encoded data are stored to fill up the data partition when an amount of the corrected errors is below a predetermined threshold.

11. The system of claim 8, wherein a page is marked to result in the marked page when the amount of corrected errors in said page exceeds a predetermined threshold.

12. The system of claim 11, wherein the marked page is replicated and stored in a reserved storage area of the memory device.

\* \* \* \* \*